(12) United States Patent
Lee

(10) Patent No.: US 8,722,526 B2
(45) Date of Patent: May 13, 2014

(54) GROWING OF GALLIUM-NITRADE LAYER ON SILICON SUBSTRATE

(75) Inventor: Sang In Lee, Sunnyvale, CA (US)

(73) Assignee: Veeco ALD Inc., Fremont, CA (US)

(*) Notice: Subject to any disclaimer, the term of this patent is extended or adjusted under 35 U.S.C. 154(b) by 0 days.

(21) Appl. No.: 13/560,881

(22) Filed: Jul. 27, 2012

(65) Prior Publication Data
US 2014/0027777 A1   Jan. 30, 2014

(51) Int. Cl.
| | |
|---|---|
| *H01L 21/28* | (2006.01) |
| *H01L 21/3205* | (2006.01) |
| *H01L 31/0256* | (2006.01) |
| *C30B 23/00* | (2006.01) |
| *C30B 25/00* | (2006.01) |
| *C30B 28/12* | (2006.01) |
| *C30B 28/14* | (2006.01) |

(52) U.S. Cl.
USPC 438/604; 257/76; 257/E21.539; 257/E23.017; 257/E29.089; 117/89; 117/90

(58) Field of Classification Search
USPC ............ 438/604; 257/76, E21.539, E23.017, 257/E29.089; 117/89, 90
See application file for complete search history.

(56) References Cited

U.S. PATENT DOCUMENTS

| | | |
|---|---|---|
| 5,298,452 A | 3/1994 | Meyerson |
| 2002/0160125 A1 | 10/2002 | Johnson et al. |
| 2009/0165715 A1 | 7/2009 | Oh |
| 2011/0220985 A1* | 9/2011 | Son et al. ............... 257/321 |
| 2012/0207928 A1* | 8/2012 | Dussarrat et al. ....... 427/255.28 |
| 2013/0026489 A1* | 1/2013 | Gambin et al. ............. 257/77 |

OTHER PUBLICATIONS

Armitage, R. et al., "Lattice-Matched HfN Buffer Layers for Epitaxy of GaN on Si," Applied Physics Letters, Aug. 19, 2002, pp. 1450-1452, vol. 81, No. 8.

* cited by examiner

*Primary Examiner* — David S Blum
(74) *Attorney, Agent, or Firm* — Fenwick & West LLP

(57) ABSTRACT

Embodiments relate to growing an epitaxy gallium-nitride (GaN) layer on a porous silicon (Si) substrate. The porous Si substrate has a larger surface area compared to non-porous Si substrate to distribute and accommodate stress caused by materials deposited on the substrate. An interface adjustment layer (e.g., transition metal silicide layer) is formed on the porous silicon substrate to promote growth of a buffer layer. A buffer layer formed for GaN layer may then be formed on the silicon substrate. A seed-layer for epitaxial growth of GaN layer is then formed on the buffer layer.

22 Claims, 10 Drawing Sheets

GROWING OF GALLIUM-NITRADE LAYER ON SILICON SUBSTRATE

BACKGROUND

1. Field of Art

The disclosure relates to forming a gallium-nitride (GaN) layer on a substrate using an atomic layer deposition (ALD) process or a pseudo-ALD process.

2. Description of the Related Art

Gallium nitride (GaN) is a very hard material that has a Wurtzite crystal structure. Its wide band gap of 3.4 eV affords it special properties for applications in optoelectronic, high-power and high-frequency devices. Hence, Gallium-nitride-based semiconductor has found its application in electro-optical components such as light emitting diodes (LED), laser diodes and detectors as well as high performance electronic components such as transistor operable with high power in high frequency region at a high temperature. Generally, GaN semiconductor is fabricated by heteroepitaxially growing a GaN layer on expensive sapphire or silicon-carbide (SiC) substrates.

A GaN layer can be epitaxially grown on a substrate, for example, using metalorganic chemical vapor deposition (MOCVD) and molecular beam epitaxy (MBE). Generally, the combination of Triethygallium (TEGa) and ammonia ($NH_3$) are used in MOCVD to epitaxially grow the GaN layer. However, such MOCVD is carried out in a high temperature where diffusion between the GaN layer and a buffer layer below the GaN layer may occur. That is, molecules of the lower buffer layer may diffuse into the upper GaN layer and Ga molecules in the upper layer may diffuse into the lower buffer layer and N molecules as well.

Such diffusion may cause, among other phenomena, distorting of a lattice structure in the lower buffer layer, distorting of a lattice structure in the GaN layer initially formed on the substrate. This increases internal stress in GaN layer and/or the buffer layer as well as increasing discontinuity between the GaN layer and the lower buffer layer. As a result, it is difficult to obtain a good quality GaN epitaxial layer using the MOCVD. Moreover, the high temperature (e.g., over 1,000° C.) during the MOCVD process may cause depreciation of nitrogen from ammonia and disassociation of carbon molecules from TeGa. The disassociated hydrocarbon gas may flow into the region of the substrate being processed, disrupting the homogeneity and stoichiometry of the layer.

In order to growing a GaN layer using MBE, a high degree of vacuum (e.g., $10^{-10}$ Torr or lower) is needed. MBE also results in low deposition rate and high production cost. Further MBE is generally inadequate for depositing a GaN layer on a large substrate or producing silicon substrates with the GaN layers in mass quantities.

SUMMARY

Embodiments relate to epitaxially growing a gallium nitride (GaN) layer on a silicon (Si) substrate deposited with an interface adjustment layer and a buffer layer. The interface adjustment layer is epitaxially grown on the silicon substrate to retain crystallinity of the silicon substrate in a subsequent fabrication process. The buffer layer is also epitaxially grown on the adjustment layer to buffer the crystallographic misfits between the Si substrate and the GaN layer. The gallium nitride layer is grown epitaxially on the buffer layer.

In one embodiment, the silicon substrate has a porous surface on which the interface adjustment layer is deposited. The porous surface may be formed by anodizing the silicon substrate.

In one embodiment, a pattern of SiN layer is deposited on the silicon substrate before anodization. In this way, the area not covered with the SiN layer is selectively anodized to have a porous surface and then deposited with the GaN layer.

In one embodiment, the surface of the silicon substrate is rendered reactive by exposing the silicon substrate to H* radicals before epitaxially growing the interface adjustment layer. The H* radicals may be generated by a radical reactor that generates H* radicals by causing plasma in a chamber filled with $H_2$ gas. The plasma is created by applying voltage different across two electrodes.

In one embodiment, the interface adjustment layer is epitaxially grown using an atomic layer deposition (ALD) process or a pseudo-ALD process.

In one embodiment, the density of site on the silicon substrate unoccupied by source precursor molecules for growing the interface adjustment layer is 1010/cm2 or less.

In one embodiment, the interface adjust layer comprises transition metal-silicide. The transition metal-silicide may be one of Hf-silicide or Zr-silicide or mixed silicide of Hf-silicide or Zr-silicide.

In one embodiment, the interface adjustment layer is epitaxially grown by injecting a Hf compound onto the silicon substrate, injecting purge gas onto the substrate after injecting the Hf compound onto the substrate, injecting H* radicals on the silicon subject injected with the Hf compound, and then subjecting the substrate to heat treatment to induce solid state reaction in the silicon substrate injected with the H* radicals.

In one embodiment, a region of the interface adjustment layer coming into contact with the silicon substrate has a higher silicon concentration compared to another region of the interface adjustment layer coming into contact with the buffer layer. Further, the other region of the interface adjustment layer coming into contact with the buffer layer has a higher nitrogen concentration compared to the region coming into contact with the silicon substrate.

In one embodiment, the gallium nitride layer is epitaxially grown on the buffer layer by growing a first epilayer of gallium nitride by an atomic layer deposition (ALD) process. Then a second epilayer of gallium nitride is grown by a pseudo-ALD process or a chemical vapor deposition (CVD) process to increase throughput.

In one embodiment, one or more of TMGa [$Ga(Me)_3$] and TeGa[$Ga(Et)_3$], $(R_3N)Ga(N_3)_3$ ($R=CH_3, C_2H_5$, etc.), $(R_3N_2)Ga(N_3)$, $(N_3)_2Ga[N\{CH_2CH_2(NEt_2)\}_2]$, and $[(RR'N)_2Ga-N_3]_n$ (where R and R' are independently hydrogen, alkyl, alkyl amine, aryl, alkyl-substituted aryl, alkyl-substituted silyl, halide or together form a cycloalkyl, and where n is from 1 to 6) is injected onto the silicon substrate to epitaxially grow the GaN layer on the buffer layer.

Embodiments also relate to a semiconductor structure having a silicon substrate epitaxially grown with an interface adjustment layer to retain crystallinity of the silicon substrate. A buffer layer is epitaxially grown on the interface adjustment layer. A gallium nitride layer is epitaxially grown on the buffer layer.

Embodiments also relate to an electronic component comprising the semiconductor structure.

DETAILED DESCRIPTION OF EMBODIMENTS

Figure 1A:
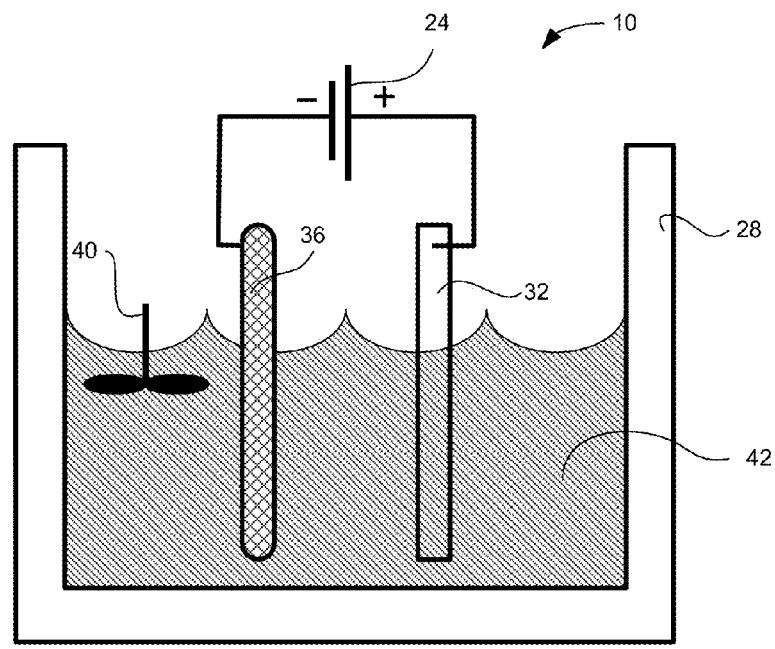
FIG. 1A is a schematic cross sectional diagram of a device for forming a porous silicon substrate, according to one embodiment.
Figure 1B:
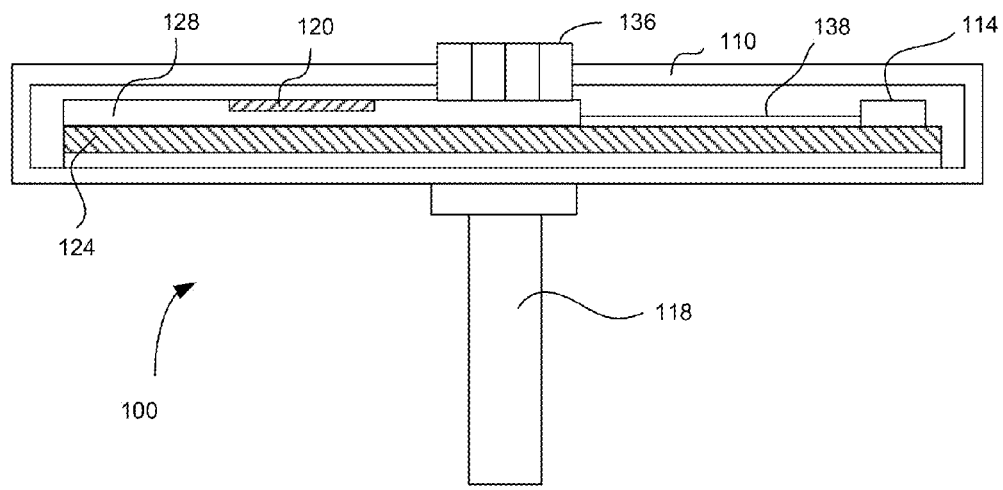
FIG. 1B is a cross sectional diagram of a linear deposition device, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to growing an epitaxy gallium-nitride (GaN) layer on a porous silicon (Si) substrate. The porous Si substrate has a larger surface area compared to non-porous Si substrate to distribute and accommodate stress caused by materials deposited on the substrate. An interface adjustment layer (e.g., transition metal silicide layer) is formed on the porous silicon substrate to promote growth of a buffer layer, enhance the quality of the buffer layer and/or retain the crystallity of the buffer layer. A buffer layer (e.g., HfN layer or ZrN layer) for GaN layer may then be formed on the silicon substrate to buffer the crystallographic misfits between the Si substrate and the GaN layer. A seed-layer for epitaxial growth of GaN layer is then formed on the buffer layer using an atomic layer deposition (ALD). Then a subsequent layer of GaN layer may be epitaxially grown to a predetermined thickness using ALD, a pseudo-ALD or a chemical vapor deposition (CVD).

Deposition of GaN Layer on Silicon Substrate

Epitaxy of GaN on a silicon substrate offers a considerable cost advantage relative to growth on sapphire or SiC. Further, epitaxy of GaN on the silicon substrate enables monolithic integration of GaN-based devices with conventional microelectronics formed on the Si substrate. However, Si substrates present additional challenges for GaN growth. That is, thick GaN epilayers often crack upon cooling to room temperature due to the severe tensile stress induced by the smaller thermal expansion coefficient of Si. Additionally, gallium exhibits poor wetting on the Si surface and regions exposed to nitrogen compounds are converted to amorphous $SiN_x$. Such conversion to amorphous $SiN_x$ disrupts epitaxial growth of a GaN layer on a silicon substrate.

Generally, the surface morphology of an epitaxial layer is largely affected by the composition of the buffer layer as well as the characteristics of the structural and electrical characteristics. In order to form a GaN epitaxial layer of superior characteristics, the misfit between the Si monocrystal substrate and the buffer layer and/or between the Si monocrystal substrate and interface adjustment layer or the defect density should be $10^{10}/cm^2$ or lower.

Forming Porous Silicon Substrate

FIG. 1A is a schematic cross sectional diagram of a device 10 for forming a porous silicon substrate, according to one embodiment. The device 10 may include, among other components, a container 28 for holding solution 42, a stirrer 40 for stirring the solution 42, and an electricity source 24. The silicon substrate 32 is coupled to a positive terminal of the electricity source 24, and is immersed in the solution 42. The silicon substrate 32 functions as an anode. A cathode (e.g., platinum) 36 is coupled to a negative terminal of the electricity source 24, and is also immersed in the solution 42.

In one embodiment, the solution 42 is a combination of 50% hydrogen fluoride (HF) and ethyl alcohol mixed to a ratio of 3:1 through 1:1. The ratio of hydrogen fluoride and ethyl alcohol is merely illustrative, and other ratios may be used. When a current density of 5 through 100 $mA/cm^2$ is applied between the cathode and the anode, the silicon substrate 32 is anodized, resulting in porous surfaces on the part of the silicon substrate 32 immersed in the solution 42. The device 10 may further include halogen lamp to increase the anodization rate of the silicon substrate 32.

The porosity of the silicon substrate 32 can be controlled by adjusting the current density in the solution 42. In a low current density (e.g., 5 $mA/cm^2$), a silicon substrate with low porosity (e.g., 20%) is obtained. As the current density is increased to 200 $mA/cm^2$, a silicon substrate with higher porosity (e.g., 50%) is obtained. In one embodiment, different levels of current density are applied at different times to form different levels of porosity at different depths of the silicon substrate 32. In one embodiment, the surface of the silicon substrate 32 has 20% porosity and the porous surface has a thickness of 0.5 μm.

Due to the porous structure, moisture and/or other substances may remain in the porous silicon substrate 32. In order to remove such moisture and/or other substances, the porous silicon substrate 32 may be baked at a temperature of 200° C. or higher for a predetermined time (e.g., 30 minutes or more). To increase the efficiency of removing such moisture and/or substances, a vacuum pump may be used to create a vacuum state (e.g., 10 Ton or less) in an oven for baking the porous silicon substrate 32. The oven may be connected to a deposition device for performing subsequent steps, as described below in detail with reference to FIGS. 1B through 5. In one embodiment, the porous silicon substrate 32 is moved to the deposition device without exposing the porous silicon substrate 32 to outer environment to prevent moisture or other substance from becoming re-adsorbed into the porous silicon substrate 32.

In one embodiment, the porous silicon substrate 32 is placed in a cleaning chamber or a deposition chamber to remove any hydroxides (e.g., $Si(OH)_x$) or other natural hydroxides that may have been formed on the porous silicon substrate 32. Well known methods such as an HF vapor method, a UV-$Cl_2$ method, or baking to a temperature higher than 500° C. (preferably to 900° C.) may be performed in conjunction with the injection of H* radicals to remove the hydroxides. Radicals of an inert gas such as He* or Ne* or Ar* radicals can also be used to remove the hydroxides. In order to form H* radicals at a low temperature, ultra-violate ray having a wavelength of 300 nm or less may be irradiated onto the substrate or H* radicals may be injected onto the substrate 32.

By exposing the substrate to at least one of H*, He*, Ne* or Ar* radicals, the surface of the porous silicon substrate 32 is also placed in a reactive state. The reactive state enables more source precursor molecules to be adsorbed on the surface of the silicon substrate 32. The increased adsorption of the source precursor molecules results in a higher deposition rate as well as a better quality deposition layer.

In one embodiment, the porous silicon substrate 32 may undergo a low temperature baking at or below 500° C. to remove remaining cleaning agent (e.g., F, Cl). This process may be obviated or shortened if the remaining cleaning agent does not significantly reduce the quality of HfN layer to be formed on the substrate 32.

A substrate of monocyrstalline silicon generally has a surface oriented in a certain direction (e.g., <100> surface or <111> surface). In contrast, porous silicon substrate advantageously has surfaces oriented in various directions. Due to such diverse orientation of surfaces, a preferred orientation is available in the surfaces of the porous silicon substrate for depositing a GaN layer. Moreover, a porous Si substrate has a larger surface area compared to non-porous Si substrate, which allows distribution and accommodation of stress caused by different thermal expansion coefficients of materials deposited on the substrate. Therefore, a GaN layer formed on the porous Si substrate is more stable and free of cracks or other deficiencies compared to a GaN layer formed on a non-porous Si substrate because the porous Si substrate has more nucleation sites.

Example Deposition Devices

Figure 2:
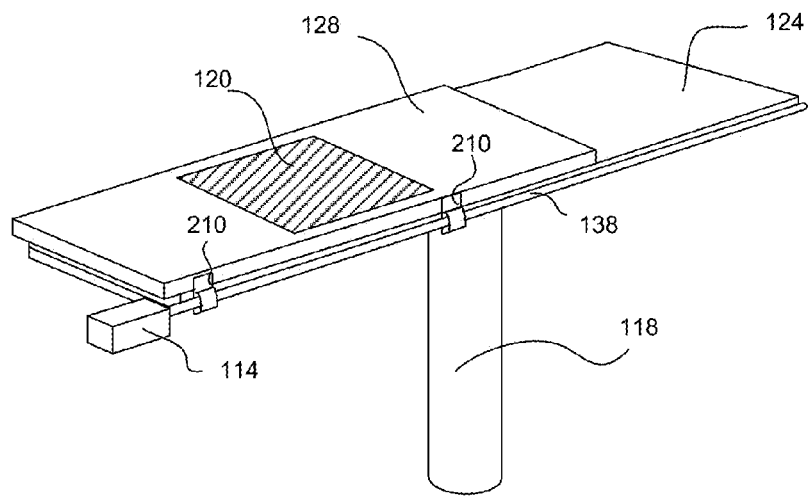
FIG. 2 is a perspective view of a linear deposition device, according to one embodiment.

Subsequent to anodizing the substrate, the porous silicon substrate 32 is placed in a linear deposition device 100 (illustrated in FIG. 1B) or a rotating deposition device 300 (illustrated in FIG. 3) to deposit one or more of an interface adjustment layer, a buffer layer and a GaN layer. FIG. 2 is a perspective view of the linear deposition device 100 (without chamber walls to facilitate explanation), according to one embodiment. The linear deposition device 100 may include, among other components, a support pillar 118, a process chamber 110 and one or more reactors 136. The reactors 136 may include one or more of injectors and radical reactors for performing molecular layer deposition (MLD), atomic layer deposition (ALD), pseudo-ALD and/or chemical vapor deposition (CVD). Each of the injectors injects source precursors, reactant precursors, purge gases or a combination of these materials onto the substrate 120 (e.g., the porous silicon substrate 32).

The process chamber enclosed by walls may be maintained in a vacuum state to prevent contaminants from affecting the deposition process. The walls may be maintained in a cool state (i.e., not heated). The process chamber 110 contains a susceptor 128 which receives a substrate 120. The susceptor 128 is placed on a support plate 124 for a sliding movement. The support plate 124 may include a temperature controller (e.g., a heater or a cooler) to control the temperature of the substrate 120. The heater of the support plate 124 may raise the temperature of the susceptor 128 and the substrate 120 to a level appropriate for the subsequent processes. The linear deposition device 100 may also include lift pins (not shown) that facilitate loading of the substrate 120 onto the susceptor 128 or dismounting of the substrate 120 from the susceptor 128.

In one embodiment, the susceptor 128 is secured to brackets 210 that move across an extended bar 138 with screws formed thereon. The brackets 210 have corresponding screws formed in their holes receiving the extended bar 138. The extended bar 138 is secured to a spindle of a motor 114, and hence, the extended bar 138 rotates as the spindle of the motor 114 rotates. The rotation of the extended bar 138 causes the brackets 210 (and therefore the susceptor 128) to make a linear movement on the support plate 124. By controlling the speed and rotation direction of the motor 114, the speed and the direction of the linear movement of the susceptor 128 can be controlled. The use of a motor 114 and the extended bar 138 is merely an example of a mechanism for moving the susceptor 128. Various other ways of moving the susceptor 128. Moreover, instead of moving the susceptor 128, the susceptor 128 may remain stationary and the reactors 136 may be moved.

Figure 3:
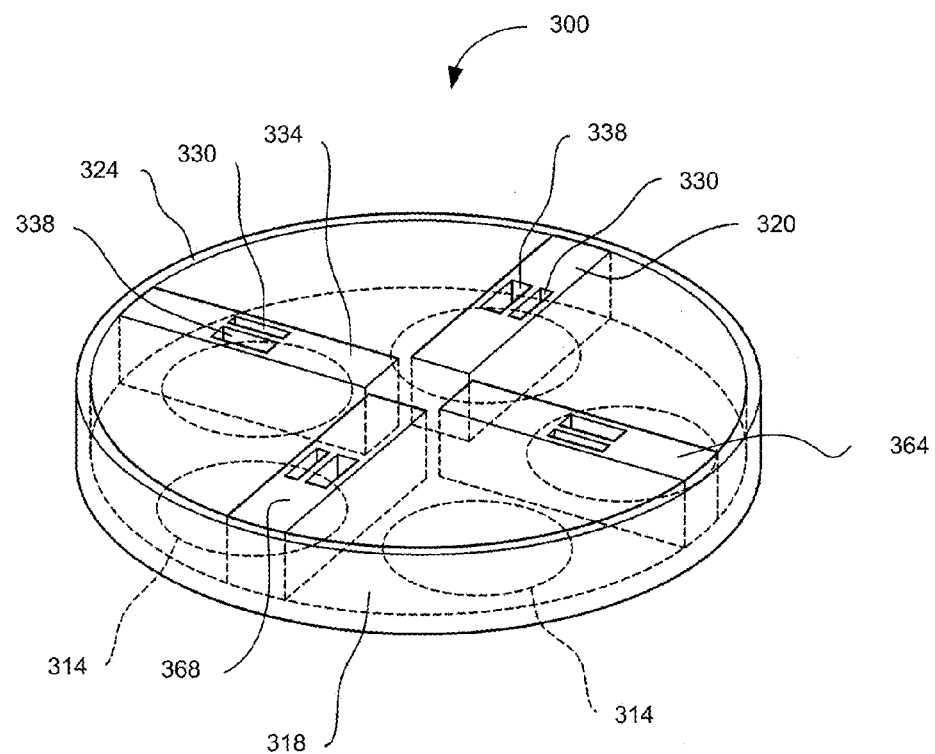
FIG. 3 is a perspective view of a rotating deposition device, according to one embodiment.

FIG. 3 is a perspective view of a rotating deposition device 300, according to one embodiment. Instead of using the linear deposition device 100 of FIG. 1, the rotating deposition device 300 may be used to perform the deposition process according to another embodiment. The rotating deposition device 300 may include, among other components, reactors 320, 334, 364, 368, a susceptor 318, and a container 324 enclosing these components. The container 324 has walls that are kept cool in a low temperature. A reactor (e.g., 320) of the rotating deposition device 300 corresponds to a reactor 136 of the linear deposition device 100, as described above with reference to FIG. 1. The susceptor 318 secures the substrates 314 in place. The susceptor 318 (and the substrate 314) may be heated to a predetermined temperature level by a heater placed below the susceptor 318. Either the susceptor 318 or the reactors 320, 334, 364, 368 rotate to subject the substrates 314 to different processes.

One or more of the reactors 320, 334, 364, 368 are connected to gas pipes (not shown) to provide source precursor, reactor precursor, purge gas and/or other materials. The materials provided by the gas pipes may be (i) injected onto the substrate 314 directly by the reactors 320, 334, 364, 368, (ii) after mixing in a chamber inside the reactors 320, 334, 364, 368, or (iii) after conversion into radicals by plasma generated within the reactors 320, 334, 364, 368. After the materials are injected onto the substrate 314, the redundant materials may be exhausted through outlets 330, 338. The interior of the rotating deposition device 300 may also be maintained in a vacuum state.

Although following example embodiments are described primarily with reference to the reactors 136 in the linear deposition device 100, the same principle and operation can be applied to the rotating deposition device 300 or other types of deposition device.

Figure 4:
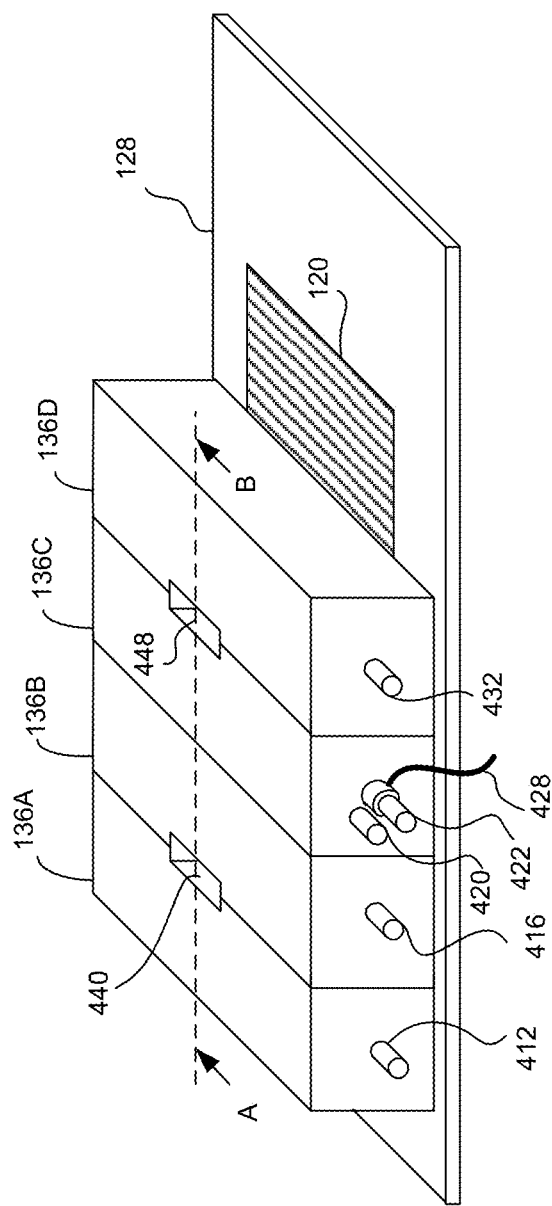
FIG. 4 is a perspective view of reactors in a deposition device, according to one embodiment.

FIG. 4 is a perspective view of reactors 136A through 136D (collectively referred to as the "reactors 136") in the deposition device 100 of FIG. 1, according to one embodiment. In FIG. 4, the reactors 136A through 136D are placed in tandem adjacent to each other. In other embodiments, the reactors 136A through 136D may be placed with a distance from each other. As the susceptor 128 mounting the substrate 120 moves from the left to the right, for example, the substrate 120 is sequentially injected with materials or radicals by the reactors 136A through 136D to form a deposition layer on the substrate 120. Instead of moving the substrate 120, the reactors 136A through 136D may move from the right to the left while injecting the source precursor materials or the radicals on the substrate 120.

In one or more embodiments, the reactors 136A, 136B, 136D are gas injectors that inject precursor material, purge gas or a combination thereof onto the substrate 120. Each of the reactors 136A, 136B, 136D is connected to pipes 412, 416, 432 to receive precursors, purge gas or a combination thereof from sources. Valves and other pipes (refer to FIG. 5) may be installed between the pipes 412, 416, 432 and the sources to control the gas and the amount thereof provided to the gas injectors 136A, 136B, 136D. Excess precursor and purge gas molecules are exhausted via exhaust portions 440, 448.

The reactor 136C may be a radical reactor that generates radicals of gas or a gas mixture received from one or more sources. The radicals of gas or gas mixture may function as purge gas, reactant precursor, surface treating agent, or a combination thereof on the substrate 120. The gas or gas mixtures are injected into the reactor 136C via pipe 420, and are converted into radicals within the reactor 136C by applying voltage across electrodes (e.g., electrode 422 and the body of the reactor 136C) and generating plasma within a plasma chamber. The electrode 422 is connected via a line 428 to a supply voltage source and the body of the reactor 136C, which forms a coaxial capacitive-type plasma reactor, is grounded or connected to the supply voltage source via a conductive line (not shown). The generated radicals are injected onto the substrate 120, and remaining radicals and/or gas reverted to an inactive state from the radicals are discharged from the reactor 136C via the exhaust portion 448.

Figure 5:
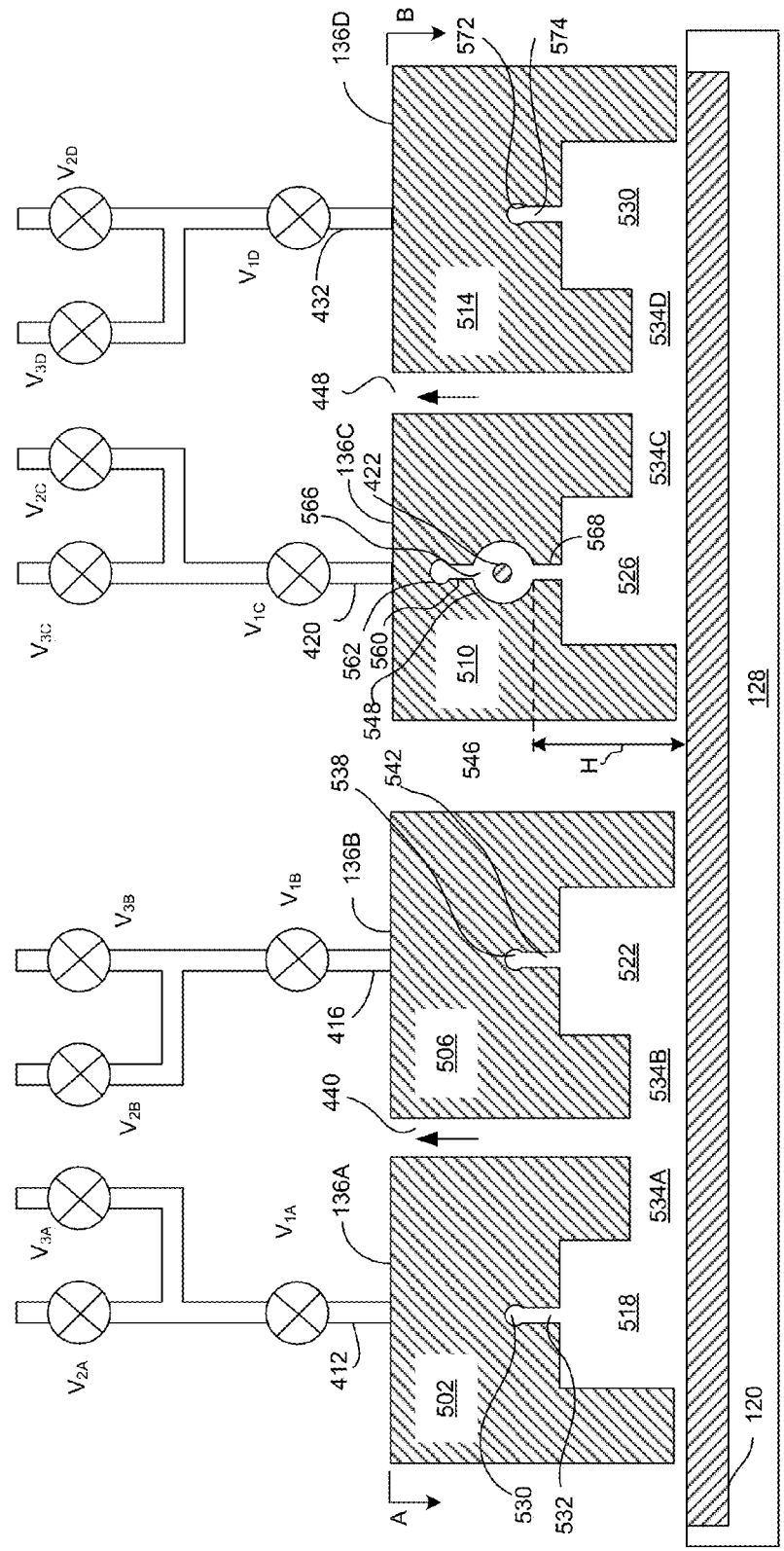
FIG. 5 is a cross sectional diagram illustrating the reactors taken along line A-B of FIG. 4, according to one embodiment.

FIG. 5 is a cross sectional diagram illustrating the reactors 136A through 136D taken along line A-B of FIG. 4, according to one embodiment. The injector 136A includes a body 502 formed with a gas channel 530, perforations (slits or holes) 532, a reaction chamber 518, a constriction zone 534A, and part of an exhaust portion 440. The gas channel 530 is connected to the pipe 412 to convey source precursor or other gas into the reaction chamber 518 via the perforations 532. The region of the substrate 120 below the reaction chamber 518 comes into contact with the source precursor and adsorbs source precursor molecules on its surface. The excess source precursor (i.e., source precursor remaining after the source precursor is adsorbed on the substrate 120) passes through the constriction zone 534A, and are discharged via the exhaust portion 440. The exhaust portion 440 is connected to an exhaust pipe (not shown).

The pipe 412 (supplying gas to the injector 136A) is connected to a valve $V_{1A}$ that controls supply of gas or mixture of gases supplied via valves $V_{2A}$ and $V_{3A}$. Each of the valves $V_{2A}$ and $V_{3A}$ may be connected to a separate gas source. The gas or mixture of gases may include carrier gas such as Ar.

While the source precursor molecules or other injected molecules pass the constriction zone 534A, physisorbed source precursor molecules are at least partially removed from the region of the substrate 120 below the constriction zone 534A due to higher flow rate of the source precursor molecules and the carrier gas (e.g., Ar). The chemisorbed molecules remain on the substrate 120.

In one or more embodiments, the injector 136B injects purge gas onto the substrate 120 to remove physisorbed source precursor molecules from the substrate 120. By injecting purge gas onto the substrate 120, only chemisorbed source precursor molecules remain on the substrate 120. The injector 136B has a similar structure as the injector 136A. That is, the injector 136B includes a body 506 formed with a gas channel 538, perforations (slits or holes) 542, a reaction chamber 522, a constriction zone 534B, and part of the exhaust portion 440. The gas channel 538 is connected to the pipe 416 to convey the purge gas into the reaction chamber 522 via the perforations 542. The purge gas is injected onto the region of the substrate 120 below the reaction chamber 522 and removes physisorbed source precursor from the surface of the substrate 120. The purge gas may be Argon or other inert gas. The purge gas, the removed source precursor molecules and by-products are discharged via the exhaust portion 440.

The pipe 416 (supplying gas to the injector 136B) is connected to a valve $V_{1B}$ that controls supply of gas or mixture of gases supplied via valves $V_{2B}$ and $V_{3B}$. Each of the valves $V_{2B}$ and $V_{3B}$ may be connected to a separate gas source.

The radical reactor 136C has a similar structure as the injectors 136A, 136B except that the radical reactor 136C further includes a plasma generator. The plasma generator includes an inner electrode 422 and an outer electrode 548 surrounding a plasma chamber 566 (the outer electrode 548 may be part of a conductive body 510). The body 510 is formed with, among others, a gas channel 562, perforations (slits or holes) 560, a plasma chamber 566, an injector slit 568, a reaction chamber 526 and part of the exhaust portion 448. A gas or a mixture of gases is injected via the pipe 420, channel 562 and perforations 560 into the plasma chamber 566. By applying a voltage difference between the inner electrode 422 and the outer electrode 548, plasma is generated in the plasma chamber 566. As a result of the plasma, radicals of the gas or the mixture of gases are generated within the plasma chamber 566. The generated radicals are injected into the reaction chamber 526 via the injector slit 568. The region of the substrate 120 below the reaction chamber 526 comes into contact with the radicals.

The plasma generator including the inner electrode 422, the outer electrode 548 and the plasma chamber 566 are advantageously located away from the substrate 120. By locating the plasma generator away from the substrate 120, plasma generated by the plasma generator does not affect or damage devices already formed on the substrate 120. However, radicals generally have a limited lifespan. Hence, if distance H of the plasma chamber 566 from the substrate 120 is too large, most of the generated radicals revert to an inactive state before reaching the substrate 120. Therefore, distance H may be set to a value below a threshold. In one embodiment, distance H is less than 8 cm.

The pipe 428 (supplying gas to the radical reactor 136D) is connected to a valve $V_{1C}$ that controls supply of gas or mixture of gases supplied via valves $V_{2C}$ and $V_{3C}$. Each of the valves $V_{2C}$ and $V_{3C}$ may be connected to a gas source.

In one or more embodiments, the injector 136D injects purge gas onto the substrate 120. The injector 136D has a similar structure as the injector 136B. That is, the injector 136C includes a body 514 formed with a gas channel 572, perforations (slits or holes) 574, a reaction chamber 530, a constriction zone 534D, and part of the exhaust portion 448. The gas channel 572 is connected to the pipe 432 to convey the purge into the reaction chamber 530 via the perforations 574. The purge gas is injected onto the region of the substrate 120 below the reaction chamber 530. The excess reactant precursor and by-products are discharged via the exhaust portion 448.

The pipe 432 (supplying gas to the injector 136D) is connected to a valve $V_{1D}$ that controls supply of gas or mixture of gases supplied via valves $V_{2D}$ and $V_{3D}$. Each of the valves $V_{2D}$ and $V_{3D}$ may be connected to a separate gas source (e.g., a canister).

The reactor modules 136A through 136D and their arrangement as illustrated in FIG. 5 are merely illustrative. In other embodiment, more than one radical reactor may be used. For example, the injector 136B may be replaced with a radical reactor (similar to the radical reactor 136D). Alternatively, the radical reactor 136C may be replaced with an injector having the same or similar structure as the injector 136A to inject reactant gas or other gas onto the substrate 120.

Formation of GaN Layer on Porous Silicon Substrate

In one embodiment, the porous substrate 120 is exposed to at least one of H*, He*, Ne* or Ar* radials before further processing. By exposing the porous substrate 120 to at least one of H*, He*, Ne* or Ar* radicals, the surface of the porous silicon substrate 32 is placed in a reactive state. The reactive state enables more source precursor molecules (e.g., $HfCl_4$) to be adsorbed on the surface of the silicon substrate 32. The subsequent process of injecting source precursor molecules ($HfCl_4$) may be performed in-situ to prevent impurities or moisture from being re-adsorbed on the reactive surface of the silicon substrate 32.

Figure 6A:
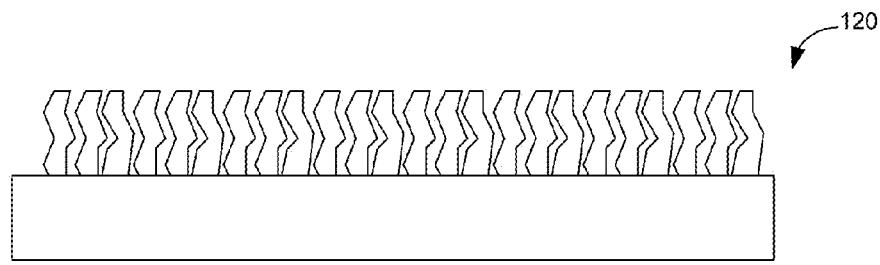
FIGS. 6A through 6D are diagrams illustrating the formation of a GaN layer on a porous silicon substrate, according to one embodiment.

FIG. 6A illustrates the porous substrate 120 formed, for example, using the device 10, as described above with reference to FIG. 1A. The linear deposition device 100 or the rotating deposition device 300 with the reactors 136A through 136D are used for forming the interface adjustment layer, the buffer layer and/or the GaN layer on the substrate 120, as described below in detail with reference to FIGS. 6B through 6D.

An interface adjustment layer is formed on the porous silicon substrate to promote growth of a buffer layer, enhance the quality of the buffer layer and/or retain the crystallinity of the silicon substrate during the process involving nitrogen compounds (e.g., $NH_3$, $NH_2$—$NH_2$) and N* radicals. The nitridation of the silicon substrate causes the silicon substrate to become amorphous, which may inhibit the epitaxial growth of the buffer layer and/or the GaN layer. The interface adjustment layer functions to retain the crystalline structure of the substrate. The interface adjustment layer also functions to prevent diffusion of atoms in the silicon substrate and the buffer layer. A silicide generally has lower tendency for nitridation compared to silicon and maintains the crystalline structure of the silicon substrate intact. Hence, silicide can be used as a material for the interface adjustment layer. Further, to promote the growth of the buffer layer to be deposited on the interface adjustment layer, it is advantageous to use transition metal-silicide including metal atoms that are also included in the buffer layer. For example, metal silicides such as Hf-silicide, Zr-silicide, Ni-silicide and Co-silicide are used as the material for the buffer layer. In one embodiment, one of Hf-silicide or Zr-silicide or mixed silicide of Hf-silicide or Zr-silicide is used in the interface adjustment layer.

In order to form the interface adjustment layer, the injector 136A injects $HfCl_4$ as the source precursor on the substrate 120 and the radical reactor 136C injects H* radicals on the substrate 120, as the substrate 120 moves from the left to the right as shown in FIG. 4. The density of sites in the substrate 120 unoccupied by Hf atom results in defect density preferably at or below $10^{10}/cm^2$. Such low density of unoccupied sites is facilitated by exposure of the substrate 120 to H* radicals or radicals of inert gas before injecting $HfCl_4$ gas onto the substrate 120. The injectors 136B, 136D inject purge gas (e.g., Ar gas) onto the substrate 120 to remove any physisorbed source precursor molecules or reactant precursor molecules from the surface of the substrate 120 while leaving behind chemisorbed source precursor molecules or reactant precursor molecules. Alternatively, at least part of the physisorbed source precursor molecules may be left on the substrate to perform pseudo-ALD process. During the injection, the temperature within the deposition device 100, 300 is maintained at the temperature of 200° C. to 450° C. to minimize the diffusion of Hf atoms into a silicon substrate.

Figure 6B:
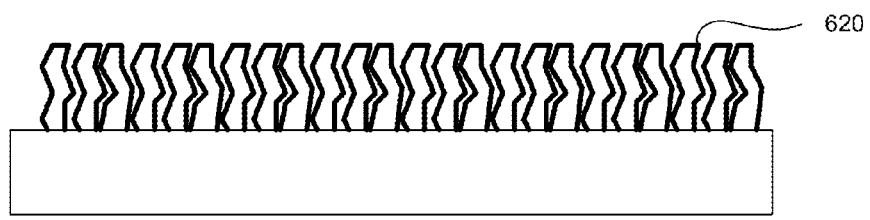

As a result of moving the substrate 120 below the reactors 136A through 136D inject gases or radicals onto the substrate 120, a metallic Hf layer is deposited on the substrate 120. In one embodiment, the Hf metallic layer has a thickness of 3 Å to 100 Å. FIG. 6B illustrates the substrate 120 deposited with the metallic Hf layer subject to heat treatment in Ar, or $N_2$ or $NH_3$ environment to form Hf-silicide layer (HfSi or $HfSi_2$) 620 on the substrate 120 by solid state reaction. Alternatively, an Hf-silicide layer may be formed directly on the substrate 120 by mixing and injecting a Si source with a Hf source onto the substrate 120 or by forming Si thin film after the formation of Hf thin film on the substrate 120, for example, by an ALD method such as a thermal ALD process or a radical-assisted ALD process.

As a Si source, inorganic Si compounds such as $SiCl_4$ and $SiC_{12}H_2$ or organic Si compounds such as tris(dimethylamino)silane (3DMAS), TDMASi [$Si(NMe_2)_4$], TDEASi [$Si(NEt_2)_4$] and TEMASi [$Si(NEtMe)_4$] are injected into the radical reactor 136 to deposit a silicide thin film of 5 Å to 200 Å on the substrate 120. In this way, the silicide thin film can be advantageously deposited on the substrate 120 at a low temperature. The deposition rate of the silicide thin film can be increased by providing a number of radical reactors. Further, at least one of H*, He*, Ne* or Ar* radials may be injected before injecting source precursor to place the substrate 120 in a reactive state for increasing the source precursor molecules adsorbed on the surface of the silicon substrate 120, and thereby increase the deposition rate. Further, the process of injecting the purge gas (by the injector 136B and/or 136D) may be omitted to increase the deposition rate. By omitting the process of injecting the purge gas, a pseudo-ALD process faster than an ALD process can be performed on the substrate 120 to deposit the silicide at a higher rate.

In one embodiment, the composition of the silicide layer on the substrate 120 (serving as the interface adjustment layer) differs at different locations. For example, the lower portion of silicide contacting the silicon substrate may be Si-rich whereas the upper portion of silicide coming into contact with transition metal nitride is N-rich for a chemical affinity.

Figure 6C:
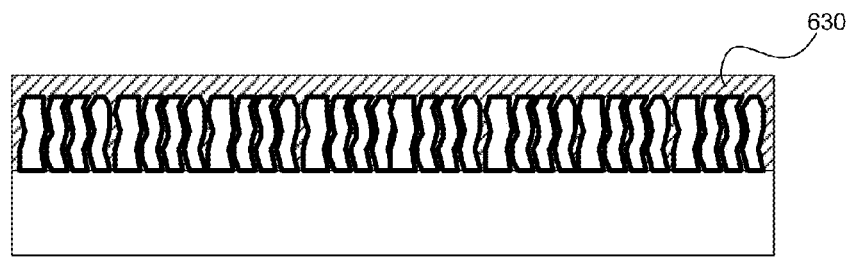

FIG. 6C illustrates a buffer layer 630 (an HfN layer or a ZrN layer) formed on the substrate 120 after forming the interface adjustment layer 620, according to one embodiment. The buffer layer 630 functions to buffer the crystallographic misfits between the substrate 120 and the GaN layer 640 to be formed thereon. Nitrides of refractory metals are generally suitable for the buffer layer 630 since they have a high melting point, a high electrical conductivity and prevent diffusion of silicon atoms. Among various refractory metal nitrides, HfN has a lattice parameter of 4.52 Å with NaCl structure, and the mismatch of lattice parameter of HfN (111) against GaN (0001) is merely 0.35%. Therefore, HfN is especially suitable as material for the buffer layer 630.

In order to form the HfN layer as the buffer layer 630, organic Hf compounds such as TDMAHf [$Hf(NMe_2)_4$], TDEAH [$Hf(NEt_2)_4$] and TEMAHf [$Hf(NEtMe)_4$] or inorganic Hf compounds such as $HfCl_4$ are first injected on the surface of the substrate 120 (for example, by the injector 136A) for adsorption in the substrate 120. In order to convey Hf molecules to the surface of the substrate 120, carrier gas such as Argon and $N_2$ gas may be used. Alternatively, a liquid delivery system that injects liquid material containing Hf molecules directly into a chamber can also be used. After delivering the Hf molecules or compounds to the substrate 120, purge gas (e.g., Ar gas or $N_2$ gas) is injected (for example, by the injector 136B) on the substrate 120 to retain only chemisorbed molecules and remove physisorbed molecules from the surface of the substrate 120. In one embodiment, the silicon substrate 120 is exposed to Hf molecules for a predetermined time (e.g., about 0.1 to 10 seconds) at a predetermined pressure (e.g., 10 mTorr to 10 Torr).

After removing physisorbed molecules from the surface of the substrate 120 by the purge gas, the substrate 120 retains a monolayer of Hf molecules on its surface. The substrate 120 is then subject to a reactant gas with nitrogen compounds such as $NH_3$, and $NH_2$—$NH_2$. Such nitrogen compounds react or replace molecules bonded with Hf atoms and forms HfN monolayer on the surface of the substrate 120. In one embodiment, the reaction or replacement of molecules continue for 0.1 seconds to several seconds under the pressure of 10 mTorr to 10 Torr at a temperature at or below 450° C. The by-product gas results from the molecules released from the Hf atom. Such by-product gas is removed by purge and pumping. Purge gas such as $N_2$ and Ar may be injected to facilitate the removal of the bi-product gas. The formation of HfN monolayer completes a single cycle of ALD process.

To increase the reactivity of the reactant gas, N* radicals can be generated and injected onto the substrate 120 by a radical reactor (e.g., radical reactor 136C) in lieu of or in conjunction with the nitrogen compounds. Alternatively or additionally, ultraviolet ray having a wavelength of 300 nm or less may be irradiated on the substrate to increase the reactivity. When using the radical reactor 136C, a shielding grid may be provided in the radical reactor 136C to remove electrons or ions present in the radicals. In one embodiment, the shielding grid is made of metallic Hf to minimize the contamination.

A ZrN layer can be formed on the substrate in lieu of the HfN layer as the buffer layer. For this purpose, Zr-silicide can be formed on the surface as the interface adjustment layer. Other than injecting an inorganic or organic compound including Zr for adsorption in the substrate 120, the remaining processes are similar to the processes described above with reference to the formation of HfN monolayer except that source gas and reactant for depositing a ZrN monolayer are injected on the substrate.

If insufficient purge gas is injected onto the substrate for removal of physisorbed Hf molecules, physisorbed Hf molecules may remain on the substrate 120. Hence, when the nitrogen compound is injected onto the substrate 120, more than one layer of HfN may be formed on the substrate 120 due to the physisorbed Hf molecules remaining on the substrate 120. By retaining more Hf molecules (albeit physisorbed Hf molecules) on the substrate 120, the deposition rate of HfN can be increased. Such process may be referred to as a "pseudo-ALD" process since more than one atomic layer is deposited in a cycle. The HfN layer formed by pseudo-ALD process has properties inferior to the HfN layer formed by an ALD process in terms of the layer density, the level of impurities remaining and the number of defects. However, the HfN layer formed by pseudo-ALD process still exhibits superior properties compared to HfN layer formed by a chemical vapor deposition (CVD) process, adequate for a large number of applications.

In one embodiment, the ALD process or the pseudo-ALD process may be repeated to form a HfN buffer layer of a desired thickness (e.g., 50 Å to 5000 Å). The desired thickness may be 500 Å.

Before proceeding to the process of forming a GaN layer, the substrate 120 is injected with $NH_3$ so that the surface of the buffer layer (e.g., HfN layer) is covered with nitrogen atoms. That is, the dangling bonds on the surface of the buffer layer are passivated with nitrogen atoms or the top surface of the HfN layer is covered with nitrogen atoms. During this passivation process, the partial pressure of moisture and oxygen is maintained at $10^{-7}$ Torr or less, preferably at $10^{-8}$ Torr or less. This passivation process may be omitted albeit the quality of the GaN epilayer may be degraded somewhat.

In order to deposit a GaN seed-layer, organic Ga compounds such as TMGa [$Ga(Me)_3$] and TeGa[$Ga(Et)_3$] are injected onto the surface of the substrate 120 (previously formed with the interface adjustment layer and the buffer layer) for adsorption, for example, by the injector 136A. To provide gallium molecules onto the substrate 120, bubbling system using carrier gas such as Argon or Nitrogen or a liquid delivery system where liquid compounds are injected directly into a vaporizer may be used. Instead of the organic Ga compounds, gallium azide compounds such as $(R_3N)Ga(N_3)_3$ ($R=CH_3$, $C_2H_5$, etc.), $(R_3N_2)Ga(N_3)$, $(N_3)_2Ga[N\{CH_2CH_2(NEt_2)\}_2]$, and $[(RR'N)_2Ga—N_3]_n$ (where R and R' are independently hydrogen, alkyl, alkyl amine, aryl, alkyl-substituted aryl, alkyl-substituted silyl, halide or together form a cycloalkyl, and where n is from 1 to 6) may also be used.

The substrate 120 with gallium molecules adsorbed in its surface is injected with purge gas, for example, by the injector 136B to remove physisorbed gallium molecules from the surface while retaining chemisorbed gallium molecules on the surface.

Then the substrate 120 is injected with reactive compounds such as $NH_3$, $NH_2$—$NH_2$ to react or replace molecules bonded with gallium atoms. As a result, a GaN monolayer is formed on the surface of the substrate. The by-products resulting from the molecules previously bonded with gallium atoms are purged and pumped out from the deposition device. The reactive compounds are injected onto the substrate 120 for 0.1 to several seconds (preferably under 10 seconds) under the pressure of 10 mTorr to 10 Torr. The temperature of the substrate is maintained at a low temperature (e.g., at or below 500° C.) where diffusion into or from the GaN layer does not occur or occurs at a negligible rate.

In order to increase the reactivity of the reactive compounds, N* radicals can be generated and injected onto the substrate 120 in place of or in conjunction with $NH_3$ or $NH_2$—$NH_2$ gas by a radical reactor (e.g., radical reactor 136C). Alternatively or additionally, nitrogen compound may be exposed to ultraviolet ray having a wavelength of 300 nm or less to increase the reactivity.

After injecting the gallium compounds, purge gas may be injected onto the substrate 120 to remove physisorbed gallium compounds from the surface of the substrate. If insufficient purge gas is injected onto the substrate for removal of physisorbed gallium compound molecules, physisorbed gallium compound molecules may remain on the substrate 120. The increased amount of gallium compound molecules remaining on the substrate 120 enables more than one layer of GaN layer to be formed on the substrate 120 in a cycle. In this way, the deposition rate of GaN can be increased. The GaN layer formed by such pseudo-ALD process has properties inferior to the GaN layer formed by an ALD process in terms of the layer density, the level of impurities remaining and the number of defects. However, the GaN layer formed by pseudo-ALD process still exhibits superior properties compared to GaN layer formed by a chemical vapor deposition (CVD) process and can be used for various applications.

The process of injecting the gallium compounds and nitrogen compounds (or N* radicals) may be repeated for a number of cycles to deposit an epitaxy GaN layer of 50 Å to 5000 Å, preferable to deposit a GaN layer of 500 Å.

The process of forming the epitaxy GaN layer can be performed in the same injector or radical reactor (in-situ) as the process of forming the buffer layer. Alternatively, the process of forming the epitaxy GaN layer can be performed in an injector or radical reactor separate from the chamber or device where the process of forming the buffer layer is performed. When using separate injectors or radical reactors, it is beneficial to maintain the partial pressure of oxygen is maintained at $10^{-8}$ Torr or less and to fill the device with Argon gas or $N_2$ gas to prevent overflow of a gas from one injector or radical reactor to another injector or radical reactor during the moving of the substrate.

Figure 6D:
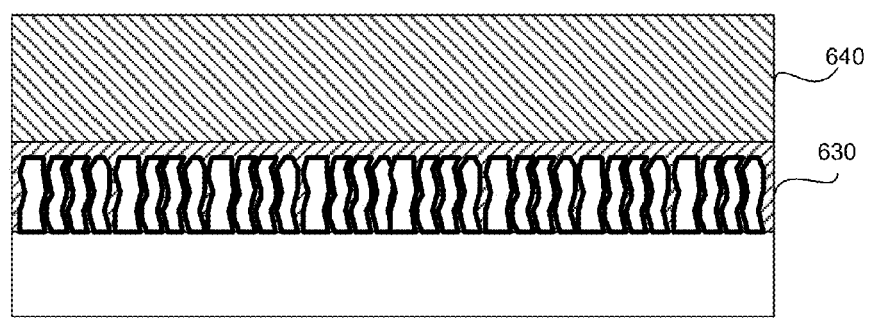

In order to grow a thicker GaN layer in the range of 1 to 100 μm, multi-stage deposition method may be added. That is, the deposition of a first epitaxy GaN layer of 50 Å to 5000 Å is followed by a remote-plasma ALD, pseudo-ALD or CVD process deposited to deposit a second epitaxy GaN layer to increase throughput. The process of forming the first epitaxy GaN layer and the process of forming the second epitaxy GaN layer can be performed in the same injector or radical reactor. Alternatively, the process of forming the first epitaxy GaN layer and the process of forming the second epitaxy GaN layer can be performed in different injectors or radical reactors. FIG. 6D illustrates a GaN layer 640 formed on the buffer layer 630 as a result of performing a high-rate ALD, pseudo-ALD or CVD process on the substrate 120.

The high-rate ALD or pseudo-ALD process may be performed by reducing the amount of purge gas injected onto the substrate to retain more gallium molecules or GaN molecules on the substrate. In one embodiment, the amount of purge gas or the amount of the time injected with the purge gas is 10 to 50% of the amount of purge gas or the amount of injection time used for totally removing physisorbed gallium molecules or GaN molecules.

In one embodiment, the number of sites on the interface adjustment layer not combining with metal atoms of the buffer layer is less than $10^{10}/cm^2$. The number of sites on the buffer layer not combining with Ga atoms is also less than $10^{10}/cm^2$. If the number of such sites exceeds $10^{10}/cm^2$, one or more of the following issues may ensue: (i) the properties of the interface may deteriorate, (ii) the crystalline structure may not be retained, and (iii) lattice misfit or crystalline defects or twin may result. Such issues may render fabrication of GaN components impractical or lower the performance of GaN components.

Selective Formation of GaN Layer on Silicon Substrate

Figure 7A:
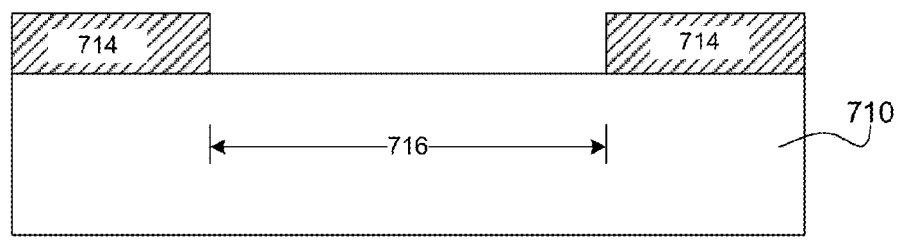
FIGS. 7A through 7E are diagrams illustrating selective formation of a GaN layer on a silicon substrate, according to another embodiment.

FIGS. 7A through 7E are diagrams illustrating the selective formation of a GaN layer on a silicon substrate, according to another embodiment. When devices such as light emitting diodes are formed on a GaN epilayer, it is beneficial to fabricate components for controlling such devices on the same Si substrate where the GaN epilayer is formed. For this purpose, part of the silicon substrate 710 is patterned with SiN layer 714 using a method well known in the art while portions 716 of the silicon substrate 710 are exposed, as illustrated in FIG. 7A. The substrate 710 is placed in the device 10 and applied with current from the electricity source 24, as described above in detail with reference to FIG. 1A.

Figure 7B:
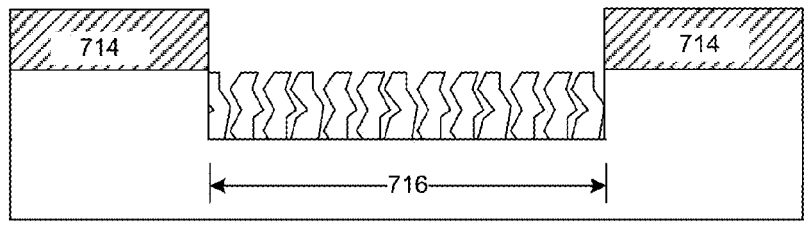
Figure 7C:
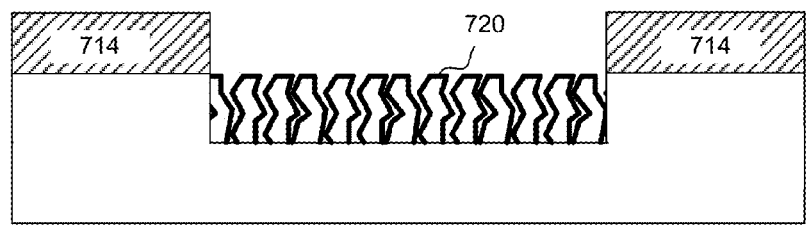
Figure 7D:
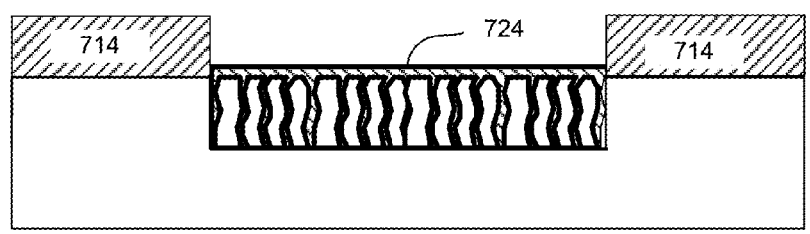
Figure 7E:
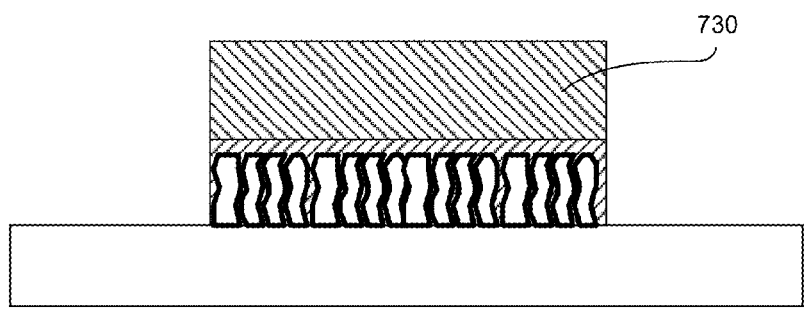

As a result, the portions 716 of the substrate 710 are anodized, forming a porous region as illustrated in FIG. 7B. The portions of the substrate 710 covered with SiN 714 are not anodized, and hence, these portions of the substrate 710 remains intact. FIG. 7C illustrates the portions 716 of the substrate 710 not covered with the SiN layer 714 deposited with an interface adjustment layer 720 using the same process, as described above in detail with reference to FIG. 6B. FIG. 7D illustrates the portions 716 of the substrate 710 deposited with a buffer layer 724 using the same process, as described above in detail with reference to FIG. 6C. On the buffer layer 724, a GaN layer 730 is deposited or grown and then the SiN layer 714 is removed to obtain the structure as illustrated in FIG. 7E.

It is to be noted that a HfN buffer layer makes an Ohmic contact with the GaN layer. Therefore, the HfN buffer layer may be used as part of a wiring structure for conducting electricity.

Processes for Forming GaN on Silicon Substrate

Figure 8:
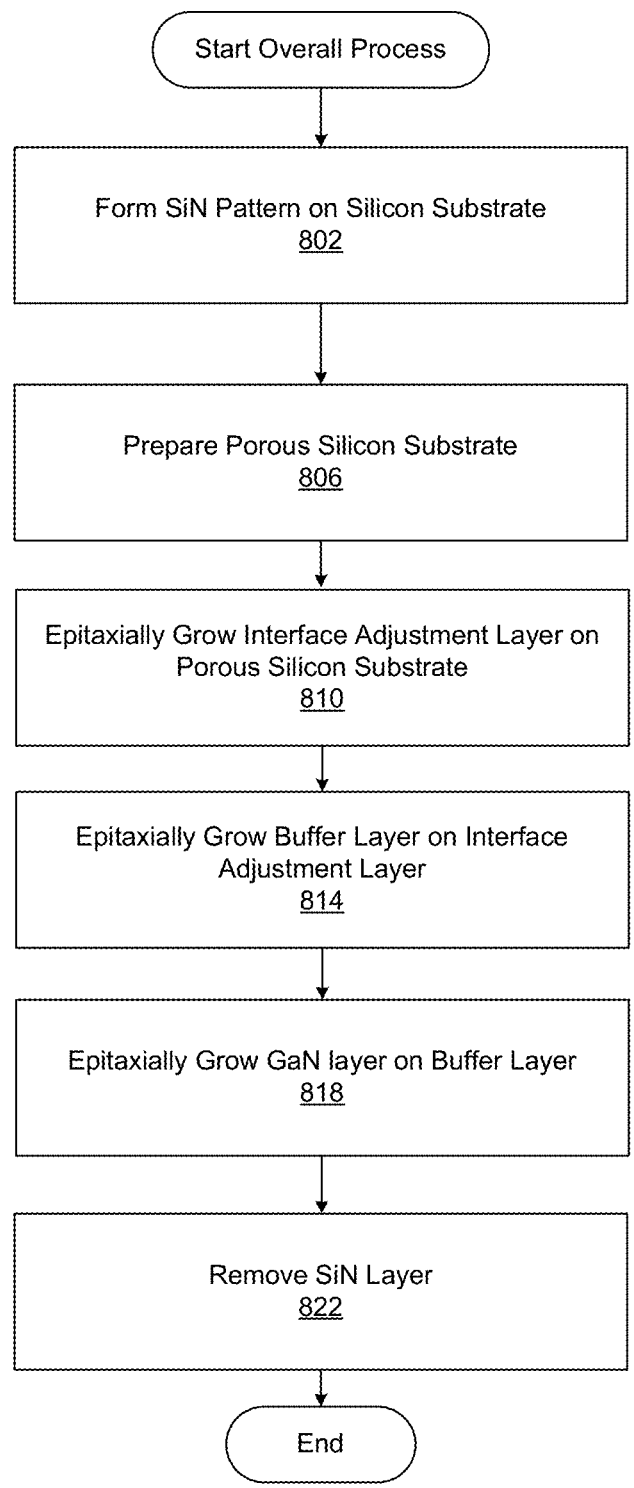
FIG. 8 is a flowchart illustrating an overall process of forming a GaN layer on a silicon substrate, according to one embodiment.

FIG. 8 is a flowchart illustrating an overall process of forming a GaN layer on a silicon substrate, according to one embodiment. First, a SiN pattern is formed 802 on a Si substrate if the GaN layer is to be selectively grown on one or more parts of the Si Substrate. If the entire surface of the Si substrate is to be grown with a GaN layer, then forming 802 of the SiN pattern can be obviated. The Si substrate is then anodized to prepare 806 a porous silicon substrate. The portions of the substrate covered by the SiN layer are not anodized.

After anodizing, the substrate is moved into a deposition device to epitaxially grow 810 an interface adjustment layer, as described above in detail with reference to FIG. 6B. Then a buffer layer is epitaxially grown 814 on the interface adjustment layer, as described above in detail with reference to FIG. 6C. Then a GaN epitaxy layer is epitaxially grown 818 on the buffer layer, as described above in detail with reference to FIG. 6D.

If the substrate is patterned with a SiN layer, the SiN layer is then removed 822. The removal of the SiN layer terminates the process.

Figure 9:
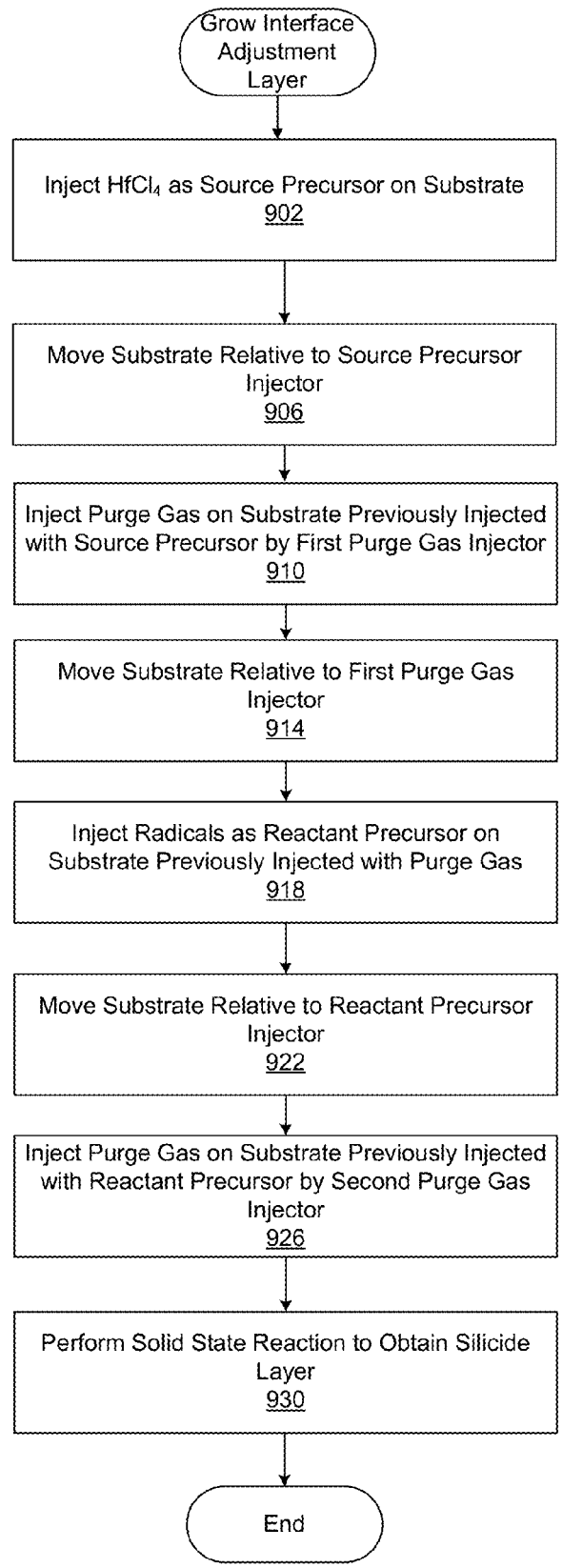
FIG. 9 is a flowchart illustrating a process of epitaxially growing an interface adjustment layer on a silicon substrate, according to another embodiment.

FIG. 9 is a flowchart illustrating a process of forming the interface adjustment layer, according to another embodiment. First, $HfCl_4$ is injected 902 on the substrate as the source precursor by a source precursor injector (e.g., the injector 136A). The substrate is then moved 906 relative to the source precursor and into a first purge gas injector (e.g., the injector 136B). The purge gas injector injects purge gas onto the substrate to remove physisorbed $HfCl_4$ from the surface of the substrate.

Then the substrate is moved 914 relative to the first purge gas injector into a radical reactor (e.g., the radical reactor 136C). The radical reactor generates H* radicals and injects 918 the radicals onto the substrate. As a result, Cl molecules bonded to the $HfCl_4$ react with H* and produced by-product gas such as Cl2, or HCl, leaving Hf atoms on the surface of the substrate.

The substrate is then moved 922 relative to the reactant precursor injector into a second purge gas injector (e.g., injector 136D). The second purge gas injector then injects 926 purge gas onto the substrate, and removes physisorbed Hf atoms and the by-product gases from the substrate.

A solid state reaction is then performed 930 on the substrate to obtain an Hf-silicide layer. Alternatively, Hf-silicide may be directly deposited on the substrate by mixing Si source and Hf source, and injecting the mixed gas onto the substrate. The process of forming the interface adjustment layer is then terminated.

In one embodiment, injection 918, 926 of purge gas is omitted to increase the deposition rate of the Hf (and consequently, increase the deposition rate of Hf-silicide rate).

Figure 10:
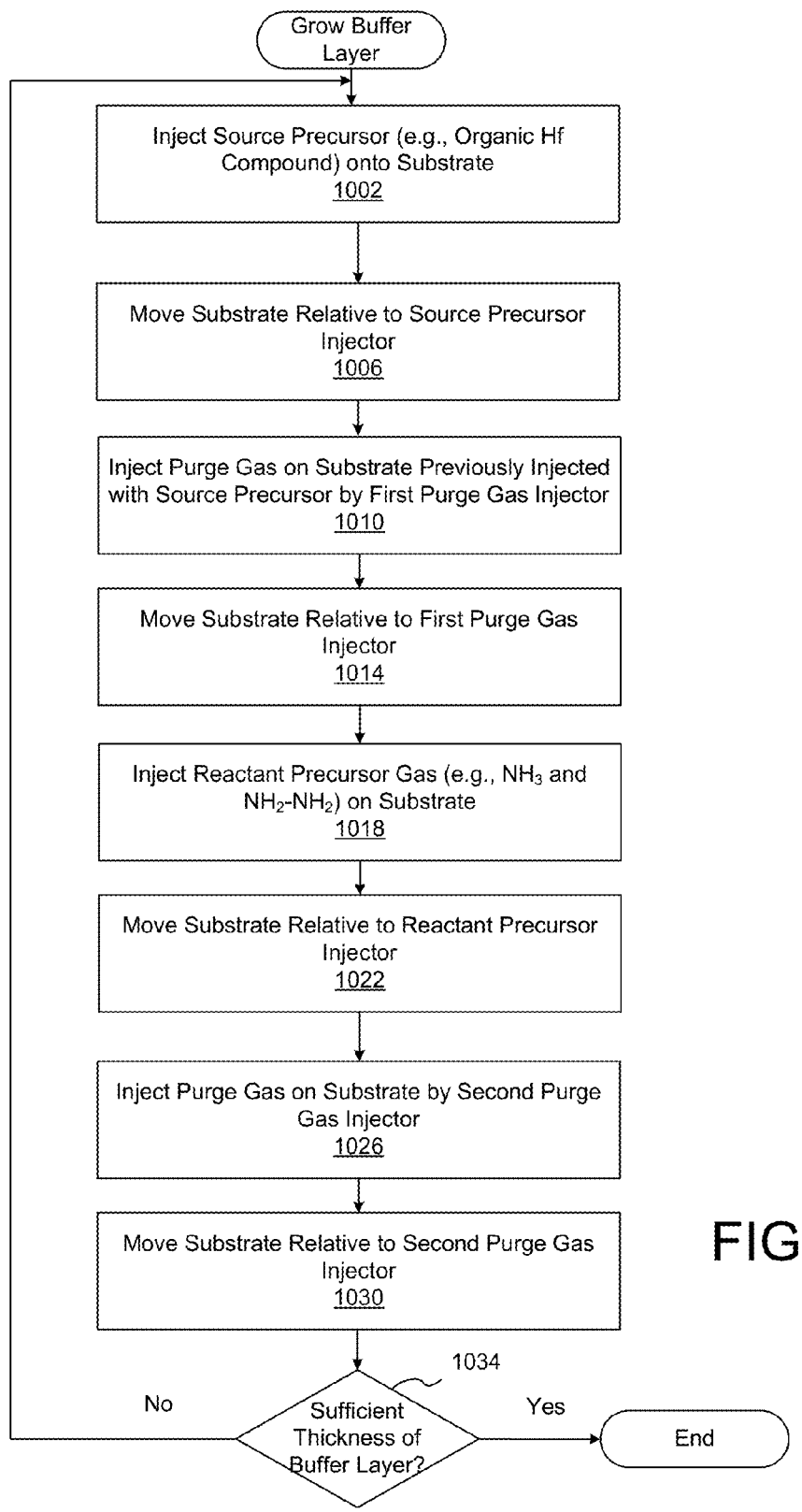
FIG. 10 is a flowchart illustrating a process of epitaxially growing a buffer layer, according to one embodiment.

FIG. 10 is a flowchart illustrating a process of epitaxially growing a buffer layer, according to one embodiment. First, the source precursor such as organic Hf compound is injected 1002 onto the substrate by a source precursor injector. The substrate is then moved 1006 relative to the source precursor injector into a first purge gas injector.

The first purge gas injector injects 1010 purge gas onto the substrate previously injected with the source precursor to remove physisorbed organic Hf compound from the surface of the substrate.

The substrate is then moved 1014 relative to the first purge gas injector into a reactant precursor injector. The reactant precursor injector injects 1018 the reactant precursor gas (e.g., $NH_3$ and $NH_2$—$NH_2$) onto the substrate. Alternatively, N* radicals may be generated and injected onto the substrate by a radical reactor. As a result of injecting the precursor gas or N* radicals, a buffer layer (e.g., HfN monolayer) is formed on the interface adjustment layer.

The substrate is then moved 1022 into a second purge gas injector. The second purge gas injector injects 1026 the purge gas onto the substrate to remove physisorbed HfN molecules from the surface of the substrate. Then the substrate is moved relative to the second purge gas 1030.

It is then determined 1034 if the thickness of the buffer layer is sufficient. If the thickness of the buffer layer is sufficient, then the process terminates. If the thickness of the buffer layer is insufficient, the process returns to injecting 1002 of the source precursor and repeats the subsequent processes to deposit another layer of HfN monolayer.

Figure 11:
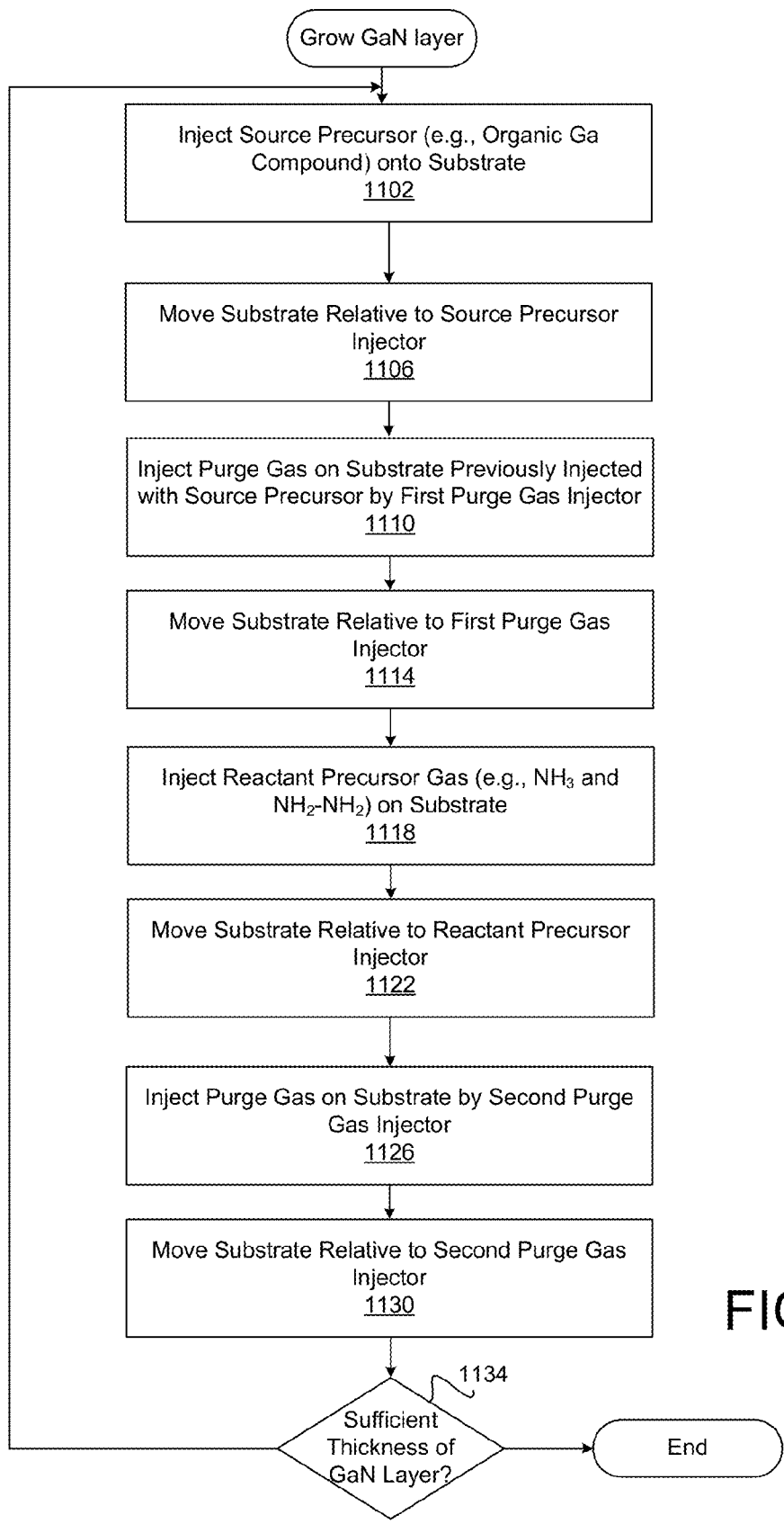
FIG. 11 is a flowchart illustrating a process of epitaxially growing a GaN layer on a buffer layer, according to one embodiment.

FIG. 11 is a flowchart illustrating a process of epitaxially growing a GaN layer, according to one embodiment. First, a source precursor such as an organic gallium compound is injected 1102 onto the substrate by a source precursor injector. Then the substrate is moved 1106 relative to the source precursor injector into a first purge gas injector. The first purge gas injector injects 1110 purge gas onto the substrate to remove physisorbed source precursor molecules while leaving behind chemisorbed source precursor molecules on the substrate.

The substrate is then moved 1114 relative to the first purge gas injector into a reactant precursor injector. The reactant precursor injector injects 1118 the reactant precursor gas (e.g., $NH_3$ and $NH_2$—$NH_2$) onto the substrate. Alternatively, N* radicals may be generated and injected onto the substrate by a radical reactor. As a result of injecting the reactant precursor gas or N* radicals, a GaN layer is formed on the substrate.

The substrate is then moved 1122 into a second purge gas injector. The second purge gas injector injects 1126 the purge gas onto the substrate to remove physisorbed GaN molecules from the surface of the substrate. Then the substrate is moved relative to the second purge gas 1130.

It is then determined 1134 if the thickness of the GaN layer is sufficient. If the thickness of the GaN layer is sufficient, then the process terminates. If the thickness of the GaN layer is insufficient, the process returns to injecting 1102 of the source precursor and repeats subsequent process to deposit another layer of GaN.

The silicon structure with the GaN layer may be used for various electronic devices including electronic components such as optoelectronic devices, high-power devices and high-frequency devices.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A method of forming a gallium nitride layer on a silicon substrate, comprising:
    anodizing the silicon substrate to form a porous surface;
    epitaxially growing an interface adjustment layer on the porous surface of the silicon substrate to promote growth of a buffer layer, enhance quality of the buffer layer or retain crystallinity of the buffer layer;
    epitaxially growing the buffer layer to buffer crystallographic misfits between the silicon substrate and a gallium nitride layer on the interface adjustment layer; and
    epitaxially growing the gallium nitride layer on the buffer layer.

2. The method of claim 1, further comprising depositing a pattern of SiN layer on the silicon substrate before anodizing the silicon substrate.

3. The method of claim 1, further comprising rendering the surface of the silicon substrate reactive by exposing the silicon substrate to radicals before epitaxially growing the interface adjustment layer.

4. The method of claim 3, wherein the radicals comprise at least one of H*, He*, Ne* or Ar* radicals.

5. The method of claim 1, wherein the interface adjust layer comprises transition metal-silicide.

6. The method of claim 5, wherein the transition metal-silicide is one of Hf-silicide or Zr-silicide or mixed silicide of Hf-silicide or Zr-silicide.

7. The method of claim 1, wherein epitaxially growing the interface adjustment layer comprises:
    injecting a Hf compound onto the silicon substrate;
    injecting purge gas onto the substrate responsive to injecting the Hf compound onto the substrate;
    injecting H* radicals on the silicon subject injected with the Hf compound; and
    subjecting the substrate to heat treatment to induce solid state reaction in the silicon substrate injected with the H* radicals.

8. The method of claim 1, wherein a region of the interface adjustment layer coming into contact with the silicon substrate has a higher silicon concentration compared to another region of the interface adjustment layer coming into contact with the buffer layer, and wherein the other region has a higher nitrogen concentration compared to the region coming into contact with the silicon substrate.

9. The method of claim 1, wherein epitaxially growing the gallium nitride layer on the buffer layer comprises:
    growing a first epilayer of gallium nitride by an atomic layer deposition (ALD) process; and
    growing a second epilayer of gallium nitride by a pseudo-ALD process or a chemical vapor deposition process.

10. The method of claim 1, wherein epitaxially growing the gallium nitride layer on the buffer layer comprises injecting one or more of TMGa [$Ga(Me)_3$] and TeGa[$Ga(Et)_3$], $(R_3N)Ga(N_3)_3$ (R=$CH_3$, $C_2H_5$, etc.), $(R_3N_2)Ga(N_3)$, $(N_3)_2Ga[N\{CH_2CH_2(NEt_2)\}_2]$, and $[(RR'N)_2Ga—N_3]_n$ (where R and R' are independently hydrogen, alkyl, alkyl amine, aryl, alkyl-substituted aryl, alkyl-substituted silyl, halide or together form a cycloalkyl, and where n is from 1 to 6) onto the silicon substrate.

11. A method of forming a gallium nitride layer on a silicon substrate, comprising:
    ebitaxially growing an interface adjustment layer on the silicon substrate using an atomic layer deposition (ALD) process or a pseudo-ALD process to promote growth of a buffer layer, enhance quality of the buffer layer or retain crystallinity of the buffer layer, wherein a density of sites in the substrate unoccupied by source precursor molecules for growing the interface adjustment layer is $10^{10}/cm^2$ or less;
    epitaxially growing the buffer layer to buffer crystallographic misfits between the silicon substrate and the gallium nitride layer on the interface adjustment layer; and
    ebitaxially growing the gallium nitride layer on the buffer layer.

12. The method of claim 11 further comprising rendering the surface of the silicon substrate reactive by exposing the silicon substrate to radicals before epitaxially growing the interface adjustment layer.

13. The method of claim 11, wherein epitaxially growing the interface adjustment layer comprises:
injecting a Hf compound onto the silicon substrate;
injecting purge gas onto the substrate responsive to injecting the Hf compound onto the substrate;
injecting H* radicals on the silicon subject injected with the Hf compound; and
subjecting the substrate to heat treatment to induce solid state reaction in the silicon substrate injected with the H* radicals.

14. The method of claim 11, wherein a region of the interface adjustment layer coming into contact with the silicon substrate has a higher silicon concentration compared to another region of the interface adjustment layer coming into contact with the buffer layer, and wherein the other region has a higher nitrogen concentration compared to the region coming into contact with the silicon substrate.

15. The method of claim 11, wherein epitaxially growing the gallium nitride layer on the buffer layer comprises:
growing a first epilayer of gallium nitride by an atomic layer deposition (ALD) process; and
growing a second epilayer of gallium nitride by a pseudo-ALD process or a chemical vapor deposition process.

16. A semiconductor structure comprising:
a silicon substrate comprising a porous surface;
an interface adjustment layer epitaxially grown on the porous surface of the silicon substrate to promote growth of a buffer layer, enhance the quality of the buffer layer or retain crystallity of the buffer layer;
the buffer layer epitaxially grown on the interface adjustment layer; and
a gallium nitride layer epitaxially grown on the buffer layer.

17. The semiconductor structure of claim 16, wherein the surface of the silicon substrate is rendered reactive by exposing the silicon substrate to H* radicals before epitaxially growing the interface adjustment layer.

18. The semiconductor structure of claim 15, wherein the interface adjustment layer comprises one of transition metal silicides, Hf-silicide or Zr-silicide or mixed silicide of transition metal silicides, Hf-silicide or Zr-silicide.

19. The semiconductor structure of claim 16, wherein a region of the interface adjustment layer coming into contact with the silicon substrate has a higher silicon concentration compared to another region of the interface adjustment layer coming into contact with the buffer layer, and wherein the other region has a higher nitrogen concentration compared to the region coming into contact with the silicon substrate.

20. The semiconductor structure of claim 16, wherein the gallium nitride layer on the buffer layer comprises:
a first epitaxial layer of gallium nitride grown by an atomic layer deposition (ALD) process; and
a second epitaxial layer of gallium nitride grown on the first epitaxial layer of gallium nitride with higher deposition rate than the first epitaxial layer.

21. A semiconductor structure comprising:
a silicon substrate;
an interface adjustment layer epitaxially grown on the silicon substrate using an atomic layer deposition (ALD) process or a pseudo-ALD process to promote growth of a buffer layer, enhance the quality of the buffer layer or retain crystallity of the buffer layer, wherein a density of sites on the substrate unoccupied by source precursor molecules for growing the interface adjustment layer is $10^{10}/cm^2$ or less;
the buffer layer epitaxially grown on the interface adjustment layer; and
a gallium nitride layer epitaxially grown on the buffer layer.

22. The semiconductor structure of claim 21, wherein the interface adjustment layer comprises one of transition metal silicides, Hf-silicide or Zr-silicide or mixed silicide of transition metal silicides, Hf-silicide or Zr-silicide.

* * * * *